United States Patent [19]

Haruyama

[11] Patent Number: 5,550,388

[45] Date of Patent: Aug. 27, 1996

[54] HETEROJUNCTION FET HAVING BARRIER LAYER CONSISTING OF TWO LAYERS BETWEEN CHANNEL AND BUFFER LAYERS

[75] Inventor: Junzi Haruyama, Tokyo, Japan

[73] Assignee: NEC Corporation, Tokyo, Japan

[21] Appl. No.: 359,905

[22] Filed: Dec. 20, 1994

[30] Foreign Application Priority Data

Dec. 22, 1993 [JP] Japan .................................. 5-324967

[51] Int. Cl.$^6$ .................................................. H01L 29/06
[52] U.S. Cl. ............................ 257/24; 257/190; 257/194
[58] Field of Search .................................. 257/24, 27, 20, 257/190, 194

[56] References Cited

U.S. PATENT DOCUMENTS

| | | | |
|---|---|---|---|
| 5,343,057 | 8/1994 | Gerard et al. | 257/20 |
| 5,367,182 | 11/1994 | Matsugatani et al. | 257/190 |
| 5,373,168 | 12/1994 | Ando et al. | 257/24 |

FOREIGN PATENT DOCUMENTS

| | | | |
|---|---|---|---|
| 63-278277 | 11/1988 | Japan | 257/190 |
| 1-143270 | 6/1989 | Japan | 257/190 |
| 4-212427 | 8/1992 | Japan | 257/24 |

OTHER PUBLICATIONS

Maezawa et al., "An AlGaAs/In$_x$Ga$_{1-x}$As/AlGaAs (0<x<0.5) Pseudomorphic HEMT on GaAs Substrate Using an In$_{x/2}$Ga$_{1-x/2}$As Buffer Layer," *IEEE Transactions on Electron Devices*, vol. 37, No. 6, Jun. 1990, pp. 1416–1421.

*Primary Examiner*—Sara W. Crane
*Assistant Examiner*—Courtney A. Bowers

[57] ABSTRACT

A heterojunction FET disclosed herein includes a semi-insulating GaAs substrate, a buffer layer composed of an undoped In$_{y/2}$Al$_{1-y/2}$As layer (0<y<1), and having a film thickness less than or equal to a critical film thickness, a first barrier layer composed of an undoped AlAs layer and an undoped In$_y$Al$_{1-y}$As layer (0<y<1), a channel layer composed of an undoped In$_y$Ga$_{1-y}$As layer (0<y<1), a second barrier layer composed of an N-type In$_y$Al$_{1-y}$As layer (0<y<1), each layer disposed in the order mentioned, on the semi-insulating GaAs substrate, a gate electrode which is selectively disposed on the second barrier layer to form a Schottky junction, and electrodes for a drain and a source, each of which is disposed on the second barrier layer via a contact layer, with said gate electrode therebetween.

3 Claims, 3 Drawing Sheets

HETEROJUNCTION FET HAVING BARRIER LAYER CONSISTING OF TWO LAYERS BETWEEN CHANNEL AND BUFFER LAYERS

BACKGROUND OF THE INVENTION

1. Field of the Invention

This invention relates to a heterojunction FET (Field Effect Transistor), and more particularly to a heterojunction FET, formed on a GaAs substrate, in which a high gain is obtained in such a high frequency band having a wavelength on the order of millimeter.

2. Related Art

Referring to FIG. 2, a heterojunction FET of a prior-art technique which provides a high gain in a millimeter wavelength band will be explained. This heterojunction FET includes a semi-insulating GaAs substrate 1, an undoped and graded $In_{(0-0.5)}Al_{(1-0.5)}As$ layer (buffer layer) 2A having a film thickness of 1000 nm, an undoped $In_{0.5}Al_{0.5}As$ layer (first barrier layer) 3A having a film thickness of 100 nm, an $In_{0.5}Ga_{0.5}As$ layer (channel layer) 4A having a film thickness of 15 nm, a silicon-doped N-type $In_{0.5}Ga_{0.5}As$ layer (second barrier layer) 5A having a film thickness of 50 nm, a silicon-doped N-type $In_{0.5}Al_{0.5}As$ layer (contact layer) 6A having a film thickness of 100 nm, a gate electrode 7 disposed on the second barrier layer 5A to form a Schottky junction, and a source and drain electrodes 8 and 9, each of which is disposed on the contact layer 6A with an ohmic contact.

In a case where an $In_xGa_{1-x}As$ layer is employed as the channel layer 4A which is sandwiched between the $In_xAl_{1-x}As$ layers 3A and 5A, the difference in band-gaps between the channel layer and the barrier layer is enlarged and the lattice constants in both layers are in good coincidence, particularly if $0<x\leq0.5$, as shown in FIG. 3, where x stands for a compositional ratio of In in an atomic ratio.

The large value of the difference in band-gaps and the coincidence of lattice constants are advantageous in order to confine electrons to the inside of the channel layer 4A. The channel layer 4A is sandwiched between the two barrier layers 3A and 5A to form a quantum well in a conduction band.

With the prior-art example shown in FIG. 2, the compositional ratio of In is of such a large value as 0.5 that in comparison with a case in which the compositional ratio of In is low, the band gap of the channel layer 4A is small, e.g., on the order of about 0.7 eV, and the effective mass of an electron is also small to obtain a high mobility of the electron.

Further, since the potential difference between each of the barrier layers 3A and 5A and the channel layer 4A is large, such as about 0.3 eV, the leakage of electons from the inside of the channel layer 4A to the buffer side is reduced to accomplish a reduction in drain conductance (gd) and an improvement in transconductance (gm). As a result, these arrangements in the heterojunction FET provide higher grain in high-frequency operation.

With the prior-art example, these effects arise from the fact that the compositional ratio of In in the channel layer 4A and barrier layers 3A and 5A is high. However, the lattice constants of these layers differ by about 0.02 nm from that of GaAs, so that dislocation is produced when a layer having a thickness greater than about 5 nm, which is a critical film thickness, is disposed on the semi-insulating GaAs substrate 1 directly.

The occurrence of dislocation and strain are suppressed by lowering a temperature for crystal growth in the buffer layer 2A from normally used 520° C. to 450° C. to produce a slight offset from stoichiometry, gradually increasing the compositional ratio of In up to 0.5 together with the film thickness, while the ratio is set to 0 on one side, and enlarging the film thickness to 1000 nm.

Referring to FIG. 4, which is a sectional view showing a second example of the prior-art, the heterojunction FET includes the semi-insulating GaAs substrate 1, an $In_{0.2}Ga_{0.8}As$ layer (buffer layer) 2B having a film thickness of 1000 nm, an undoped GaAs layer (first barrier layer) 3B having a film thickness of 50 nm, an $In_{0.4}Ga_{0.6}As$ layer (channel layer) 4B having a film thickness of 15 nm, a silicon-doped $In_{0.4}Al_{0.8}As$ layer (second barrier layer) 5B having a film thickness of 50 nm, a silicon-doped $In_{0.5}Ga_{0.6}As$ layer (contact layer) 6B having a film thickness of 100 nm, the source electrode 8, the drain electrode 9 and the gate electrode 7. Electrical characteristics in line with those of the first example of the prior art can be expected.

With the second prior art example, the first barrier layer 3B is formed of GaAs for the purpose of making the buffer layer unnecessary. However, the thicknesses of the channel layer 4B and second barrier layer 5B cannot be made greater than the critical film thickness.

Accordingly, $In_{0.2}Ga_{0.8}As$ having a value of 0.2 as an In ratio which is a half that of the channel layer 4B and a lattice constant close to that of GaAs, is inserted as a buffer layer, the film thickness of which is made to be such a large value as 1000 nm, thereby providing relaxation for stress and dislocation, especially when the second barrier layer 5B is disposed on the channel layer 4B with a film thickness larger than the critical film thickness.

If the compositional ratio of In is made less than or equal to 0.2, a heterojunction FET can be formed by disposing an $In_xAl_{1-x}As$ layer as a barrier layer on the semi-insulating GaAs substrate 1 directly or via a GaAs buffer layer and disposing an $In_xGa_{1-x}As$ layer as a channel layer on the barrier layer.

With this arrangement, however, the band gap of the channel layer is too large and a sufficient transconductance gm is not obtained. Further, electrons cannot well be confined in the channel layer. Though the above-described first and second examples of the prior art have been proposed for overcoming these shortcomings, they have not necessarily succeeded.

With the first example of the prior art, the temperature for crystal growth is lowered in an effort to control a shift from stoichiometry. However, the control is essentially difficult and there is a deterioration in crystallization properties. Further, since graded growth requires a large film thickness, dislocation occurs in the course of film growth. As a result, normal crystal growth and transistor operation are not achieved in actuality.

With the second example of the prior art, dislocation is reduced and only minor difficulties are encountered in terms of crystallization. However, since GaAs or $In_{0.4}Al_{0.6}As$ having a band gap smaller than that of the first example of the prior art is used as a barrier layer, the electrons in the channel layer flow into the barrier layer to generate a leakage current. As a result, the reduction of the drain conductance gd and enhancement of the transconductance gm cannot be realized so that there is no improvement in transistor characteristics. More specifically, it is difficult to realize an FET which is superior to a heterojunction FET with a compositional ratio of In being 0.2.

SUMMARY OF THE INVENTION

It is therefor an object of the present invention to provide a heterojunction FET used in the millimeter wavelength band with realizing a high gain.

A heterojunction FET according to the present invention is featured by comprising a semi-insulating GaAs substrate, a buffer layer including an undoped $In_{1-y/2}Al_{y/2}As$ layer whose thickness is less than a critical film thickness, a first barrier layer including undoped AlAs and undoped $In_yAl_{1-x}As$ a channel layer including an $In_yGa_{1-y}As$ layer, and a second barrier layer including an N-type $In_yAl_{1-y}As$ layer, each layer being disposed in the order mentioned, on the semi-insulating GaAs substrate.

With the present invention, a high quality channel layer may be formed with a film thickness of greater than a critical film thickness with a compositional range of In preferably defined as $0.2 < y \leq 0.5$, where y stands for an atomic ratio, to provide a heterojunction FET, which can operate in the millimeter wavelength band, exhibiting a leakage current and drain conductance gd less than a half those of a heterojunction FET having a In ratio of 0.2 as well as a enhanced transconductance gm which is substantially more than doubled.

BRIEF DESCRIPTION OF THE DRAWING

The foregoing and other objects, features, and advantages of the invention will be apparent from the following more particular description of preferred embodiments of the invention, as illustrated in the accompanying drawings, in which.

DESCRIPTION OF THE PREFERRED EMBODIMENT

A preferred embodiment of the present invention will now be described with reference to FIGS. 1 and 3.

Figure 1:
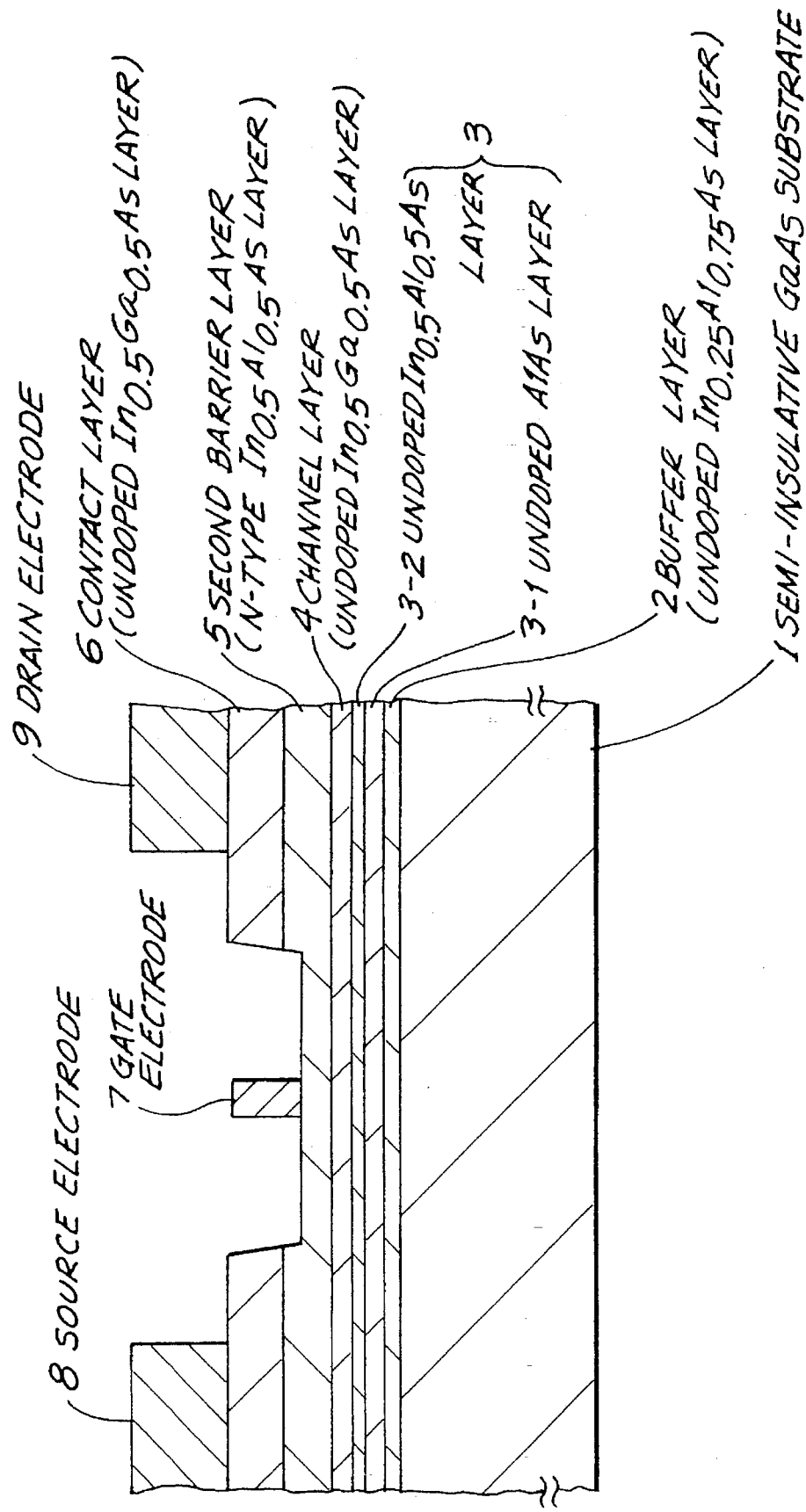
FIG. 1 is a sectional view illustrating a first embodiment of heterojunction FET according to the present invention.
Figure 2:
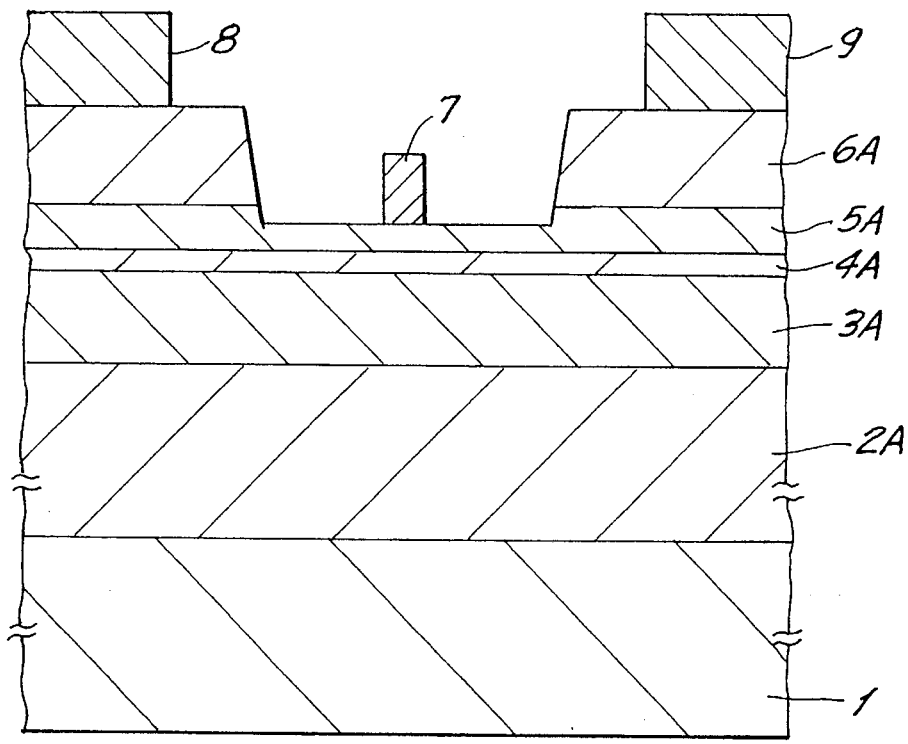
FIG. 2 is a sectional view illustrating a first prior-art example of heterojunction FET.
Figure 4:
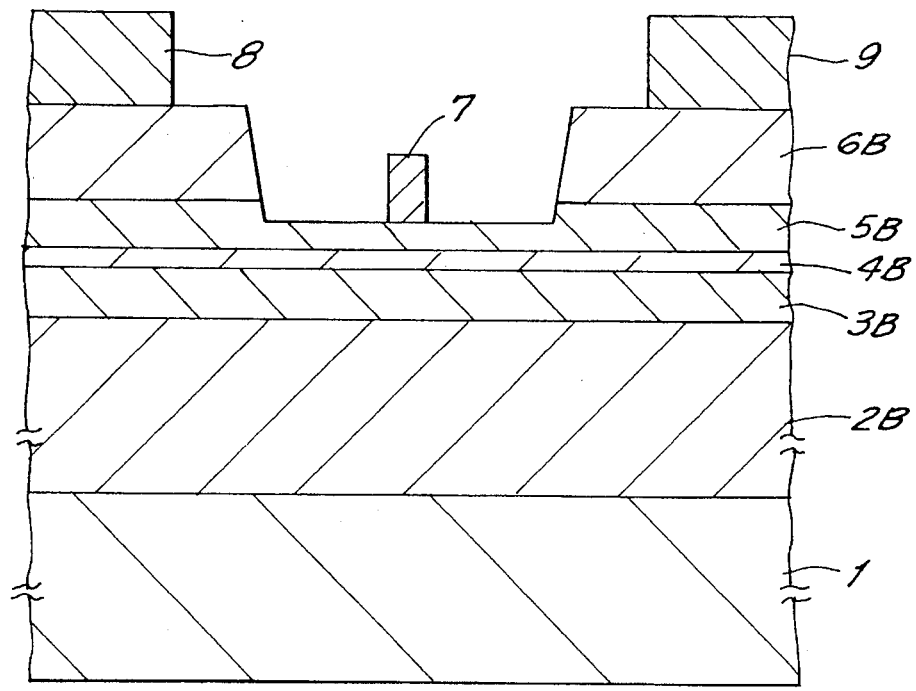
FIG. 4 is a sectional view illustrating a second prior-art example of heterojunction FET.

Referring to FIG. 1, a buffer layer 2 which is composed of an undoped $In_{0.25}Al_{0.75}As$ layer and has a critical film thickness of 15 nm, is disposed on one surface of a semi-insulating GaAs substrate 1.

A first barrier layer 3 disposed on the buffer layer 2 comprises an undoped AlAs layer 3-1 having a thickness of 20 nm and an undoped $In_{0.5}Al_{0.5}As$ layer 3-2 having a thickness of 15 nm.

A channel layer 4 disposed on the first barrier layer 3 comprises an undopod $In_{0.5}Ga_{0.5}As$ layer having a thickness greater than 15 nm, e.g., 20 nm.

A second barrier layer 5 disposed on the channel layer 4 comprises an N-type $In_{0.5}Al_{0.5}As$ layer which is being doped with a dose of $1 \times 10^{18}$ cm² silicon and has a thickness of 50 nm.

A gate electrode 7 is selectively formed on the second barrier layer 5 to form a Schottky junction. A drain electrode 9 and a source electrode 8 are respectively disposed on the second barrier layer via a contact layer 6 (an N-type $In_{0.5}Ga_{0.5}As$ layer having a thickness of 60 nm) with the gate electrode 7 therebetween.

The channel layer 4 is an $In_{0.5}Ga_{0.5}As$ layer having the same compositional ratio as the first example of the prior art. As a result, the channel layer exhibits a small band gap of 0.7 eV and the effective mass of an electron in the channel layer 4 is small to obtain a high value of electron mobility.

Since a part of the barrier layer 3 consists of the undopod AlAs layer 3-1 exhibiting a large band gap of 2.2 eV, the difference relative to the channel layer 4 approximates to 0.6 eV on the side of the conduction band so that the effect for confining electrons inside the channel layer 4 is enhanced. As a result, incomparison with the case in which the compositional ratio of In is 0.2, the drain conductance gd is approximately halved while the transconductance gm is approximately doubled. As a result, the gain is more than doubled in the millimeter band.

Figure 3:
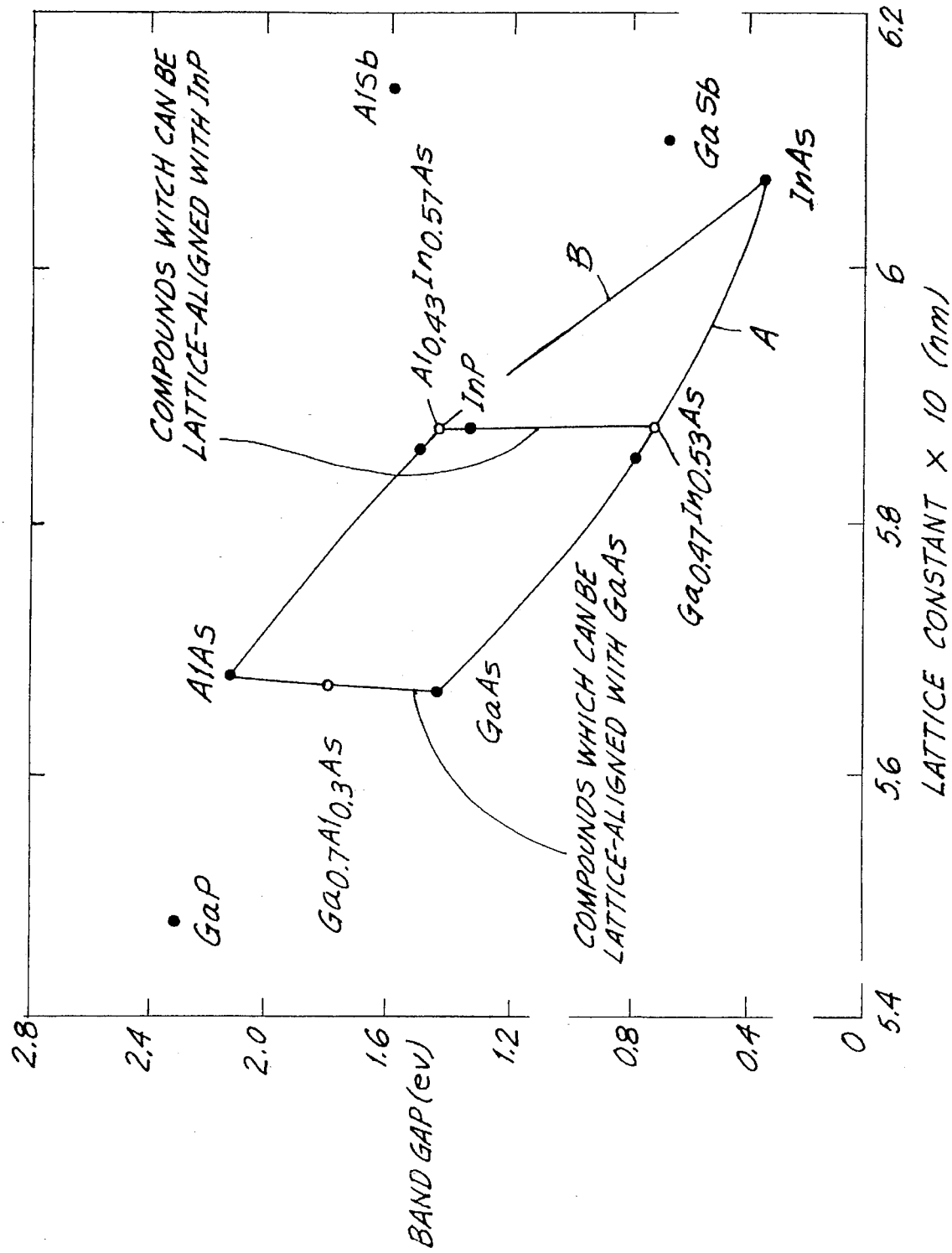
FIG. 3 is a graph illustrating relations between lattice constant and band gap with respect to composition for explanation of the present invention.

Referring to FIG. 3, $In_{0.5}Ga_{0.5}As$ and $In_{0.5}Al_{0.5}As$ have lattice constants that differ from that of GaAs by about 0.02 nm. More specifically, $In_{0.5}Ga_{0.5}As$ is at a point indicated by a dot located slightly left to $In_{0.47}Ga_{0.53}As$ on compositional state diagram A between GaAs and InAs while $In_{0.5}Ga_{0.5}As$ is at a point indicated by a dot located slightly left to $Al_{0.43}In_{0.57}As$ on a compositional state diagram B between AlAs and InAs, as shown in FIG. 3. The lattice constant is obtained by projection from a point corresponding to a desired composition to a lattice constant axis(x-axis).

If $In_{0.5}Ga_{0.5}As$ and $In_{0.5}Ga_{0.5}As$ layers are grown directly on the GaAs substrate to a thickness greater than 5 nm, which is the corresponding critical film thickness, strain and dislocation may be produced due to the difference in lattice constants between GaAs and each of $In_{0.5}Ga_{0.5}As$ and $In_{0.5}Al_{0.5}As$.

As shown in FIG. 3, AlAs has a lattice constant almost identical with that of GaAs. Accordingly, the undoped AlAs layer 3-1 may be grown directly on the GaAs substrate 1, but the undoped $In_{0.5}Al_{0.5}As$ layer 3-2 and channel layer 4 cannot be grown to a thickness greater than the critical film thickness.

However, with the present embodiment, in which the layers 3-1, 3-2 are grown via the $In_{0.5}Ga_{0.5}As$ layer (buffer layer 2) whose thickness is less than the critical film thickness, stress which leads to strain and dislocation between the layers 3-1 and 3-2 can be relaxed and layers 3-1 and 3-2 can be grown to the above-mentioned film thicknesses which are greater than the corresponding critical film thickness.

In addition, by making the thickness of the buffer layer 2 less than the critical film thickness, it is possible to grow the buffer layer 2 directly on the semi-insulating substrate GaAs 1 without dislocation.

According to the present embodiment, it is unnecessary to lower the temperature for crystal growth to form the buffer layer 2, as is done in the first example of the prior art.

The film thickness of the buffer layer 2 is less than the critical film thickness, and stress between the undoped AlAs layer 3-1 and undoped $In_{0.5}Al_{0.5}As$ layer 3-2 is alleviated by the buffer layer 2. As a result, it is possible to prevent the occurrence of a deterioration in crystallinity and dislocation during film growth, which are substantially caused by a shift from stoichiometry.

Furthermore, leakage current from the channel layer, which is a problem encountered in the second example of the prior art, is reduced by more than a half using an InAlAs layer, which has a band gap larger than that of an InGaAs layer, as the barrier layers 3-2 and 5, both layers having the same compositional ratio of In, with the channel layer 4 therebetween.

A heterojunction FET having substantially the same characteristics as those of the above-described embodiment, may also be realized by using an undoped $In_{0.2}Al_{0.8}As$ layer having a thickness of 20 nm as the buffer layer 2, stacked layers of an undoped AlAs layer having a thickness of 20 nm and an undoped $In_{0.4}Al_{0.8}As$ layer having a thickness of 15 nm as the first barrier layer 3, an undoped $In_{0.4}Ga_{0.6}As$ layer having a thickness of 15 nm as the channel layer 4, an N-type $In_{0.4}Al_{0.6}As$ layer having a thickness of 50 nm as the second barrier layer 5, and an N-type $In_{0.4}Ga_{0.6}As$ layer having a thickness of 60 nm as the contact layer 6.

In this case, since the compositional ratio of In in the buffer layer 2 is as small as 0.2 and the lattice constant is close to that of GaAs, the critical film thickness becomes 20 nm so that the buffer layer may be disposed up to this thickness. This is advantageous in that the occurrence of dislocation and strain due to lattice misalignment can be prevented with greater reliability.

As described above, the present invention makes it possible to form a high quality channel layer to a thickness of greater than 15 nm with a compositional ratio of In preferably as defined by $0.2<y\leq0.5$ by disposing an undoped $In_{y/2}Al_{1-y/2}As$ layer as the buffer layer whose thickness is less than the critical film thickness on the semi-insulating GaAs substrate, a first barrier layer comprising undoped AlAs and undoped $In_yAl_{1-y}As$, a channel layer comprising an $In_yGa_{1-y}As$ layer and a second barrier layer comprising an N-type $In_yAl_{1-y}As$ layer, where y stands for an atomic ratio.

As a result, it is possible to realize a heterojunction FET, which can operate in the millimeter wavelength band with a high gain, exhibiting both leakage current and drain conductance gd less than a half those of a heterojunction FET having a In ratio y=0.2 well as a transconductance gm which is more than doubled.

As many apparently; widely different embodiments of the invention can be made without departing from the present spirit and scope thereof, it is to be understood that the invention is not limited to the specific embodiments thereof except as defined in the appended claims.

What is claimed is:

1. A heterojunction field-effect transistor comprising:

a semi-insulating GaAs substrate;

a buffer layer including an undoped $In_{y/2}Al_{1-y/2}As$ layer (0<y<1) being disposed on said semi-insulating GaAs substrate and having a film thickness less than or equal to a corresponding critical film thickness;

a first barrier layer including an undoped AlAs layer disposed on said buffer layer and an undoped $In_yAl_{1-y}As$ layer disposed on said undoped AlAs layer;

a channel layer including an undoped $In_yGa_{1-y}As$ layer disposed on said first barrier layer;

a second barrier layer including an N-type $In_yAl_{1-y}As$ layer disposed on said channel layer;

a gate electrode selectively disposed on said second barrier layer to form a Schottky junction; and electrodes for a drain and a source, each of said electrodes being disposed on said barrier layer via a contact layer, wherein y stands for an atomic ratio.

2. The field-effect transistor as defined in claim 1, wherein said y is in a range defined by $0<y\leq0.5$.

3. The field-effect transistor as defined in claim 2, wherein each of said undoped AlAs layer and said undoped $In_yGa_{1-y}As$ layer has a film thickness greater than a critical film thickness.

* * * * *